(12) United States Patent
Takeshima et al.

(10) Patent No.: US 6,288,930 B1
(45) Date of Patent: Sep. 11, 2001

(54) SEMICONDUCTOR MEMORY DEVICE

(75) Inventors: Tohru Takeshima; Kouichi Noro, both of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/578,913

(22) Filed: May 26, 2000

(30) Foreign Application Priority Data

Dec. 28, 1999 (JP) .................................................. 11-375671

(51) Int. Cl.[7] .................................................. G11C 11/24
(52) U.S. Cl. ...................................... 365/145; 365/230.03
(58) Field of Search .................................. 365/145, 129, 365/230.03, 230.01

(56) References Cited

U.S. PATENT DOCUMENTS

| | | | |
|---|---|---|---|
| 5,517,445 | * | 5/1996 | Imai et al. ............................. 365/145 |
| 5,959,922 | * | 9/1999 | Jung ...................................... 365/210 |

FOREIGN PATENT DOCUMENTS

| | | |
|---|---|---|
| 5-166369 A | 7/1993 | (JP) . |
| 7-254649 A | 10/1995 | (JP) . |
| 10-70248 A | 3/1998 | (JP) . |

* cited by examiner

*Primary Examiner*—Hoai V. Ho
(74) *Attorney, Agent, or Firm*—Arent Fox Kintner Plotkin & Kahn, PLLC

(57) ABSTRACT

A semiconductor memory device has a first ferroelectric memory cell in which data is written after the device is mounted on a board, and a second ferroelectric memory cell whose capacitance is larger than that of the first ferroelectric memory cell. This second ferroelectric memory cell is utilized as a memory cell in which cipher or the like are written in the fabrication process. The second ferroelectric memory cell is formed with a combination of a plurality of the first ferroelectric memory cells. In order to realize the second ferroelectric memory cell, word lines or plate lines corresponding to a plurality memory-cell rows may be short-circuited. Alternatively, bit lines corresponding to a plurality memory-cell columns may be short-circuited.

9 Claims, 11 Drawing Sheets

SEMICONDUCTOR MEMORY DEVICE

FIELD OF THE INVENTION

The present invention relates to a semiconductor memory device. More particularly, this invention relates to a non-volatile ferroelectric memory (Ferroelectric RAM, henceforth, FeRAM). This FeRAM is obtained by using a ferroelectric in a capacitor section of a DRAM. Since data is stored with remanence of this capacitor section, the data can be held without a power source to hold data. Therefore, a FeRAM is sometimes used to store cipher and secret code (henceforth, cipher or the like) in an IC card or the like.

BACKGROUND OF THE INVENTION

FIG. 1 is a schematic diagram showing connections between memory cells, word lines, and plate lines in a conventional FeRAM. FIG. 2 is a schematic diagram showing connections between the memory cells and bit lines in the conventional FeRAM.

As shown in FIG. 1, a pair of row selection lines, consisting of a word line W and a plate line P, are connected to a group of memory cells in the row direction (henceforth, a memory-cell row) in a one-to-one relationship in the conventional FeRAM. Namely, in FIG. 1, a pair of first-row selection lines W1 and P1 are connected to memory cells 11, 12, 13, . . . in the first row. A pair of second-row selection lines W2 and P2 are connected to memory cells 21, 22, 23, . . . in the second row. A pair of third-row selection lines W3 and P3 are connected to memory cells 31, 32, 33, . . . in the third row.

As shown in FIG. 2, a pair of column selection lines, consisting of a pair of bit lines B and B, are connected to a group of memory cells in the column direction (henceforth, a memory-cell column) in a one-to-one relationship in the conventional FeRAM. Namely, in FIG. 2, a pair of first-column selection lines B11 and B12 are connected to the memory cells 11, 21, . . . in the first column. A pair of second-column selection lines B21 and B22 are connected to the memory cells 12, 22, . . . in the second column. A pair of third-column selection lines B31 and B32 are connected to the memory cells 13, 23, . . . in the third column. A pair of fourth-column selection lines B41 and B42 are connected to the memory cells 14, 24, . . . in the fourth column.

Let us consider a case of the FeRAM in which memory cells are formed with two transistors and two ferroelectric elements (ferroelectric capacitors). In such a FeRAM, the memory cells are structured as shown in FIG. 3. Namely, one electrode of each of the two ferroelectric elements C1 and C2 in each of the memory cells 11, 12, . . . , 21, 22, . . . are connected to different transistors Q1 and Q2. Whereas the other electrodes of the ferroelectric elements C1 and C2 are connected to the plate lines P1 and P2, respectively.

When the FeRAM is to be fabricated, it is generally required to write cipher or the like in a memory cell that consists of ferroelectric elements in the stage of wafer process of the fabrication process. That is because it is not preferable from the viewpoint of data security that the write operation is performed after the completed FeRAM-chip package has been mounted on a circuit board.

It has been known that external factors such as heat or hydrogen cause degradation in the characteristics of the ferroelectric element. Accordingly, even if the cipher or the like are written in the ferroelectric memory cell in the wafer process, memory information may be lost due to degradation in the characteristics of the ferroelectric memory cell. More specifically, this degradation is caused by the fact that the ferroelectric element is affected by heat or when exposed to hydrogen during the fabrication process after the write operation has been performed. The loss of stored information is a great disadvantage from the viewpoint of reliability.

During the conventional fabrication process as explained above, however, the external factors such as heat or hydrogen need to be removed as much as possible. Therefore, the fabrication process is restricted by this requirement. Further, some facilities to eliminate the influence of heat or hydrogen on the process are needed, which is different from the manufacturing facilities of an ordinary DRAM or the like. Thus, the manufacturing cost increases, which results in the costly FeRAM package.

SUMMARY OF THE INVENTION

It is an object of this invention to provide a semiconductor memory device with ferroelectric memory cells that hold memory information even if the ferroelectric elements are affected by heat or hydrogen in the fabrication process.

According to one aspect of this invention, the semiconductor memory device with ferroelectric memory cells comprises a first ferroelectric memory cell in which data is written after the device has been mounted on aboard. The semiconductor memory device further comprises a second ferroelectric memory cell, whose capacitance is larger as compared to that of the first ferroelectric memory cell. This second ferroelectric memory cell is utilized as a memory cell in which cipher or the like are written in the fabrication process.

The characteristics of the ferroelectric are determined according to a large or a small amount of capacitance of the ferroelectric. Therefore, if the cipher or the like are written in the second ferroelectric memory cell which has a larger amount of capacitance in the fabrication process, the ferroelectric memory cell can still hold the memory information even after the fabrication has been completed. The reason is, even if the ferroelectric is affected by heat or exposed to hydrogen during fabrication, the characteristics of the memory cell are not degraded to such a level that the memory information is lost.

The second ferroelectric memory cell may be formed with a combination of a plurality of first ferroelectric memory cells. Further, when the first ferroelectric memory cell has a plurality of ferroelectric capacitors (ferroelectric elements), the second ferroelectric memory cell may be formed by connecting the plurality of ferroelectric capacitors included in the first ferroelectric memory cell in parallel to each another. Based on this configuration, the capacitance of the second ferroelectric memory cell can be increased to a larger amount as compared to that of the first ferroelectric memory cell.

More specifically, when the second ferroelectric memory cell is formed with a plurality of first ferroelectric memory cells, a plurality of row selection lines (word lines, plate lines) or a plurality of column selection lines (bit lines) are short-circuited. Based on this configuration, the same information is written in the plurality of first ferroelectric memory cells in which the row selection lines (word lines, plate lines) are short-circuited. Therefore, the information written in the second ferroelectric memory cell is held in the ferroelectric memory cell, which has the capacitance a plurality of times as large as the capacitance in the case where the information is written in the first ferroelectric memory cell. Accordingly, the memory information can be held even when the ferroelectric memory cell is affected by heat or hydrogen during fabrication. The same effect can also be obtained in the case where the column selection lines (bit lines) are short-circuited.

A selection circuit may be provided. Any row selection lines (word lines, plate lines) or column selection lines (bit lines) to be short-circuited may also be selected by this selection circuit. Based on this configuration, any row selection lines (word lines, plate lines) or column selection lines (bit lines) to be short-circuited can be changed according to the amount of data such as cipher or the like to be written.

Further, a program, with which any row selection lines (word lines, plate lines) or column selection lines (bit lines) to be short-circuited are selected, may be stored in a storage unit (program storage section) such as a ROM. A control unit (program control circuit), that selects a plurality of row selection lines (word lines, plate lines) or a plurality of column selection lines (bit lines) as targets to be short-circuited based on this program, may also be provided in the semiconductor memory device. Based on this configuration, any row selection lines (word lines, plate lines) or column selection lines (bit lines) to be short-circuited can be programmably selected.

Other objects and features of this invention will become apparent from the following description with reference to the accompanying drawings.

DESCRIPTION OF THE PREFERRED EMBODIMENTS

Embodiments of the semiconductor memory device according to this invention are explained in detail below with reference to the related drawings.

Figure 1:
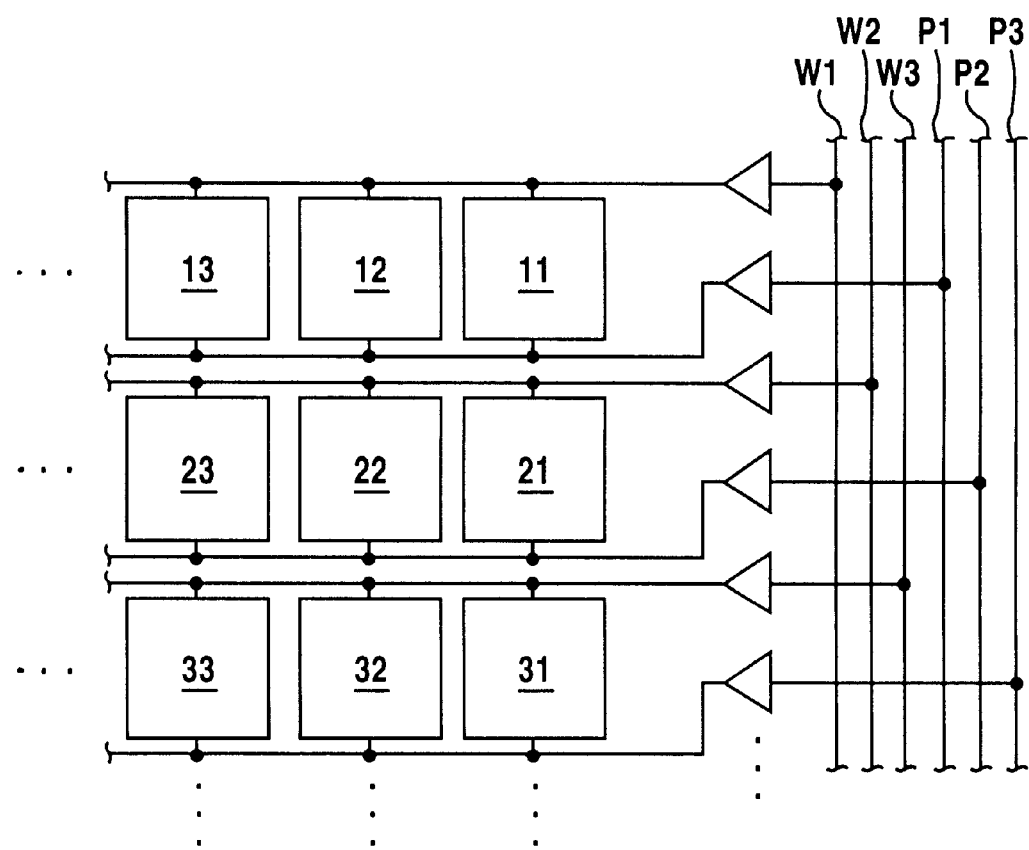
FIG. 1 is a schematic diagram showing connections between the memory cells, the word lines, and the plate lines in the conventional type of FeRAM.
Figure 2:
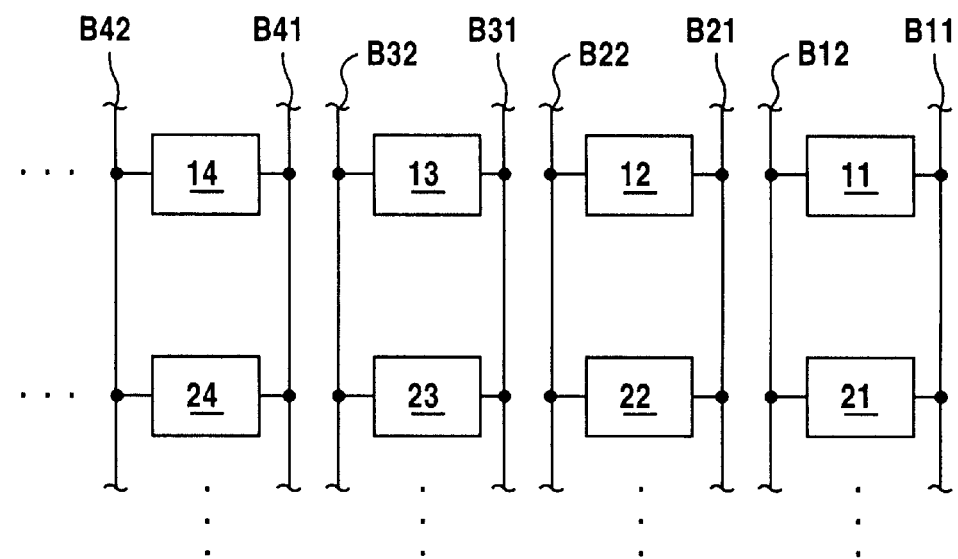
FIG. 2 is a schematic diagram showing connections between the memory cells and the bit lines in the conventional type of FeRAM.
Figure 3:
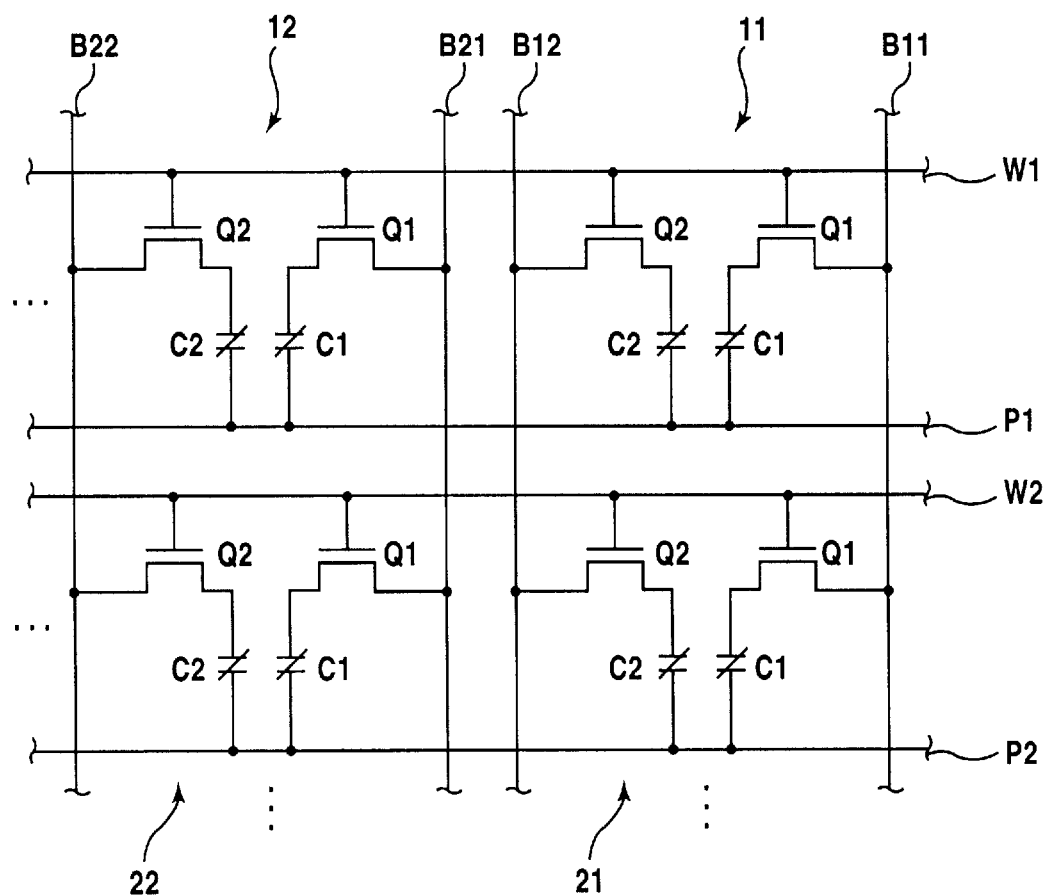
FIG. 3 is a example of the memory cell that is formed with two transistor two ferroelectric elements in the conventional type of FeRAM.
Figure 4:
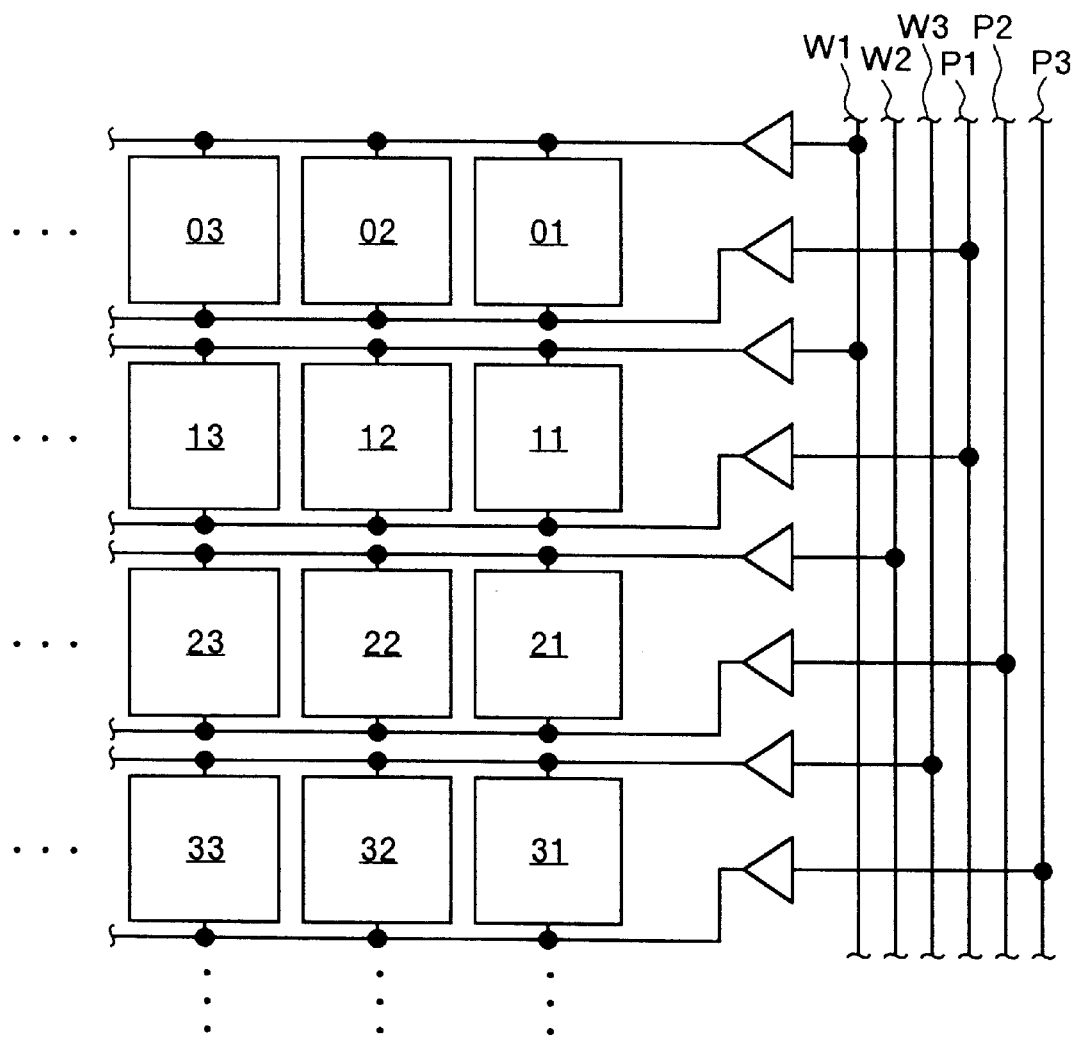
FIG. 4 is a schematic diagram showing connections between memory cells nwornes, and plate lines in a FeRAM according to a first embodiment.

FIG. 4 is a schematic diagram showing connections between memory cells, word lines, and plate lines in a semiconductor memory device according to a first embodiment. This semiconductor memory device comprises a plurality of memory cells 01, 02, . . . , 11, 12, . . . 21, 22, . . . , 31, 32, . . . as first ferroelectric memory cells. The first memory-cell row and the second memory-cell row are commonly connected to a first word line W1 and a first plate line P1.

Therefore, each pair of memory cells, which are arranged in the same column, form a second ferroelectric memory cell in the first memory-cell row and the second memory-cell row. In this case, the capacitance of this second ferroelectric memory cell is larger than that of the individual memory cell. Namely, as shown in FIG. 4, the second ferroelectric memory cell in the first column is formed with the memory cell 01 at the intersection of the $1^{st}$ row and the $1^{st}$ column (which is one in the right upper side of the memory cell array shown in FIG. 4) and the memory cell 11 at the $2^{nd}$ row-$1^{st}$ column intersection.

Similarly, the second ferroelectric memory cell in the second column is formed with the memory cell 02 at the $1^{st}$ row-$2^{nd}$ column intersection and the memory cell 12 at the $2^{nd}$ row-$2^{nd}$ column intersection. The second ferroelectric memory cell in the third column is formed with the memory cell 03 at the $1^{st}$ row-$3^{rd}$ column intersection and the memory cell 13 at the $2^{nd}$ row-$3^{rd}$ column intersection. Second ferroelectric memory cells in the fourth column and the following columns are formed in the same manner as explained above, although they are not shown in the figure.

The third memory-cell row is connected to a second word line W2 and a second plate line P2. The fourth memory-cell row is connected to a third word line W3 and a third plate line P3. The fifth memory-cell row and the following rows are connected to a corresponding word line and a corresponding plate line, respectively.

The effects due to the semiconductor memory device according to the first embodiment are explained below. The first word line W1 and the first plate line P1 are connected to both the first memory-cell row and the second memory-cell row. Therefore, the first and the second memory-cell rows are concurrently selected by the first word line W1 and the first plate line P1. Namely, a data write or a data read operation is concurrently performed in or from the memory cells in the first row and the memory cells in the second row, which are connected to the same bit lines.

Therefore, an information that is identical to the one that is written in the memory cell in the first row and the memory cell in the second row, is held in the ferroelectric memory cell. The capacitance of the ferroelectric memory cell is twice as large as the capacitance of the individual memory cell. Consequently, if data such as cipher or the like is written during the fabrication process in such a ferroelectric memory cell, the data such as cipher or the like can be held with the capacitance twice as large as the ordinary capacitance.

According to the first embodiment, as explained above, data such as cipher or the like is written during the fabrication process in the ferroelectric memory cell whose capacitance is twice as large as that of the ordinary ferroelectric memory cell. Therefore, the characteristics of the cell are not degraded to such a level that the data is lost even if the cell is affected by heat or hydrogen during fabrication. Thus, the data such as cipher or the like can be held even after the fabrication has been completed.

It is, therefore, not required to remove external factors such as heat and hydrogen as much as possible in the fabrication process, thus the restriction to the fabrication process can be eliminated. Further, any facilities to remove the influence of heat or hydrogen are not required. Thus, the manufacturing cost can be suppressed, which allows a low-cost FeRAM package to be provided. Further, data such as ID numbers can be stored in the ferroelectric memory in the wafer process.

Figure 5:
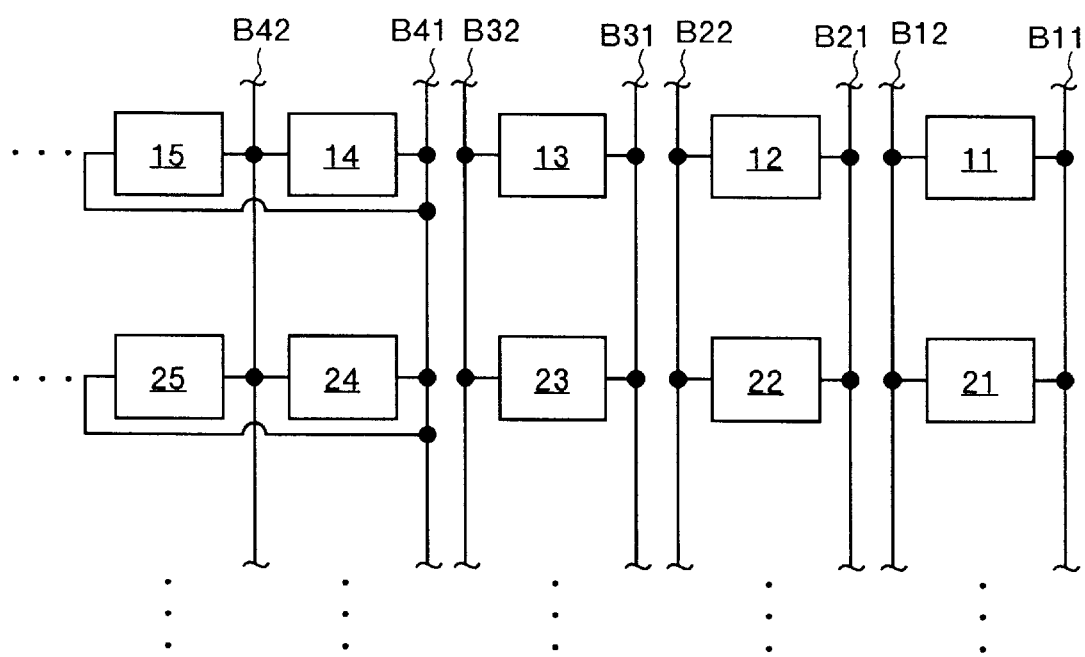
FIG. 5 is a schematic diagram showing connections between memory cells and bit lines in a FeRAM according to a second embodiment.

FIG. 5 is a schematic diagram showing connections between memory cells and bit lines in a semiconductor memory device according to a second embodiment. This semiconductor memory device comprises a plurality of memory cells 11, . . . , 14, 15, . . . , 21, . . . , 24, 25, . . . as the first ferroelectric memory cells. The fourth memory-cell column and the fifth memory-cell column are commonly connected to a fourth pair of bit lines indicated by reference signs B41 and B42.

Therefore, each pair of memory cells, which are arranged in the same row, form the second ferroelectric memory cell in the fourth memory-cell column and the fifth memory-cell column. In this case, the capacitance of the second ferroelectric memory cell is also larger than that of the individual memory cell. Namely, as shown in FIG. 5, the second ferroelectric memory cell in the first row is formed with the memory cell 14 and the memory cell 15. More specifically, the memory cell 14 exists at the $1^{st}$ row-$4^{th}$ column intersection, whereas the memory cell 15 exists at the $1^{st}$ row-$5^{th}$ column intersection (which is one in the left upper side of the memory cell array shown in FIG. 5). Similarly, the second ferroelectric memory cell in the second row is formed with the memory cell 24 at the $2^{nd}$ row-$4^{th}$ column intersection and the memory cell 25 at the $2^{nd}$ row-$5^{th}$ column intersection. Those in the third column and the following columns are formed in the same manner as explained above.

The first memory-cell column is connected to a first pair of bit lines B11 and B12. The second memory-cell column is connected to a second pair of bit lines B21 and B22. The third memory-cell column is connected to a third pair of bit lines B31 and B32. The sixth memory-cell column and the following columns are connected to each corresponding pair of bit lines, respectively.

The effects due to the semiconductor memory device according to the second embodiment are explained below. The fourth pair of bit lines B41 and B42 are connected to both the fourth memory-cell column and the fifth memory-cell column. Therefore, the fourth memory-cell column and the fifth memory-cell column are concurrently selected by the fourth pair of bit lines B41 and B42. Namely, the data write or the data read operation is concurrently performed in or from the memory cells in the fourth column and the memory cells in the fifth column, which are connected to the same word lines and the plate lines.

Therefore, the identical information, that is written in the memory cell in the fourth column and the memory cell in the fifth column, is resultantly held in the ferroelectric memory cell, whose capacitance is twice as large as the capacitance of the individual memory cell. Consequently, if data such as cipher or the like is written, in the fabrication process, in the ferroelectric memory cell which has twice as much capacitance, the data such as cipher or the like can be held with the capacitance twice as large as the ordinary capacitance.

According to the second embodiment, as explained above, data such as cipher or the like is written during the fabrication process in the ferroelectric memory cell whose capacitance is twice as large as that of the ordinary ferroelectric memory cell. Therefore, the characteristics of the cell are not degraded to such a level that the data is lost even if the cell is affected by heat or hydrogen during fabrication. Thus, the data such as cipher or the like can be held even after the fabrication has been completed.

It is, therefore, not required to remove external factors such as heat and hydrogen as much as possible, thus, the restriction to the fabrication process can be eliminated. Further, any facilities to remove the influence of heat or hydrogen are not required. Thus, the manufacturing cost can be suppressed, which allows a low-cost FeRAM package to be provided.

Figure 6:
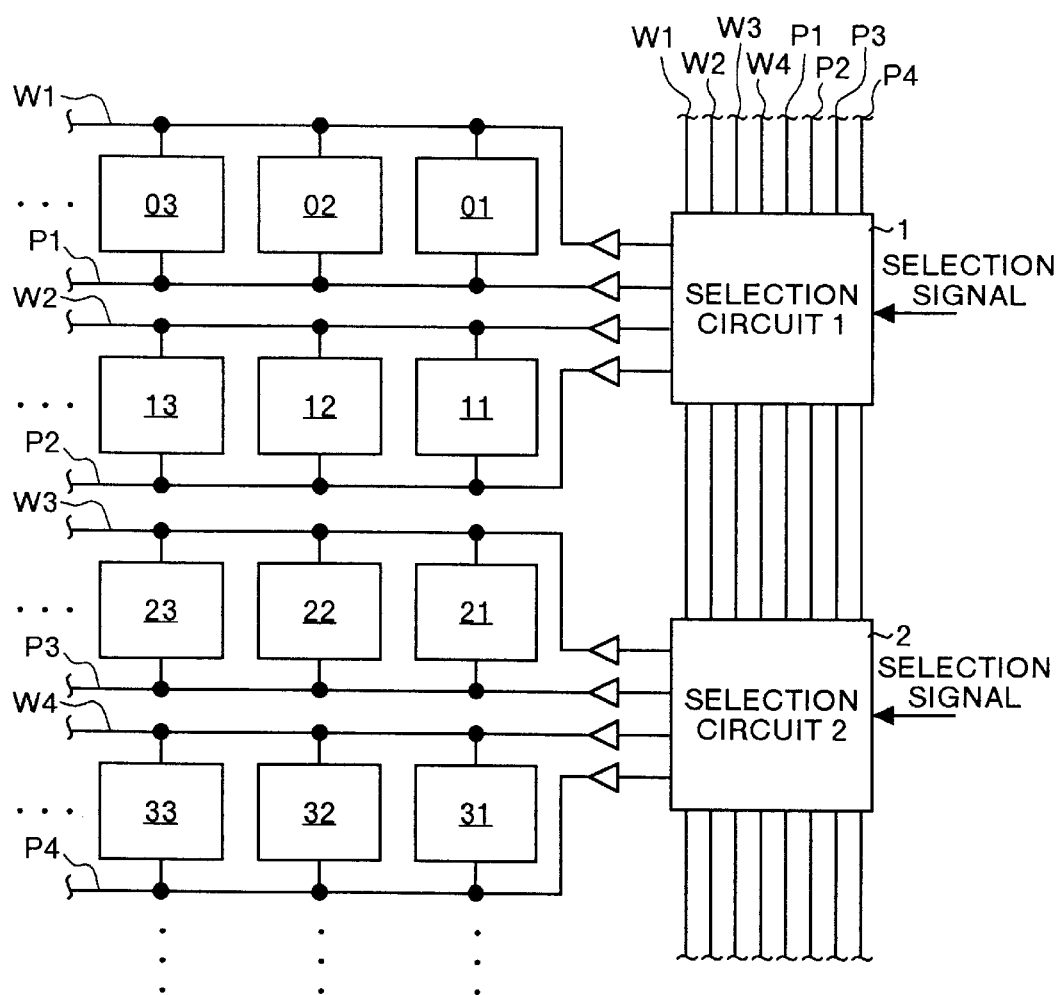
FIG. 6 is a schematic diagram showing connections between memory cells, word lines, and plate lines in a FeRAM according to a third embodiment.

FIG. 6 is a schematic diagram showing connections between memory cells, word lines, and plate lines in a semiconductor memory device according to a third embodiment. The third embodiment is realized by providing a plurality of selection circuits 1, 2, . . . (only two circuits are shown in FIG. 6); each circuit selects word lines and plate lines to be short-circuited, in the semiconductor memory device according to the first embodiment.

In the example shown in FIG. 6, the first word line W1 and the first plate line P1 are connected to the first memory-cell row. The second word line W2 and the second plate line P2 are connected to the second memory-cell row. The first selection circuit 1 then makes a selection, based on the selection signal received from the outside, as to whether the first word line W1 and the second word line W2, and the first plate line P1 and the second plate line P2 are to be concurrently short-circuited.

The third word line W3 and the third plate line P3 are connected to the third memory-cell row. The fourth word line W4 and the fourth plate line P4 are connected to the fourth memory-cell row. The second selection circuit 2 then makes a selection, based on the selection signal received from the outside, as to whether the third word line W3 and the fourth word line W4, and the third plate line P3 and the fourth plate line P4 are to be concurrently short-circuited. The same operations as explained above are performed to the fifth memory-cell row and the following rows.

Figure 7:
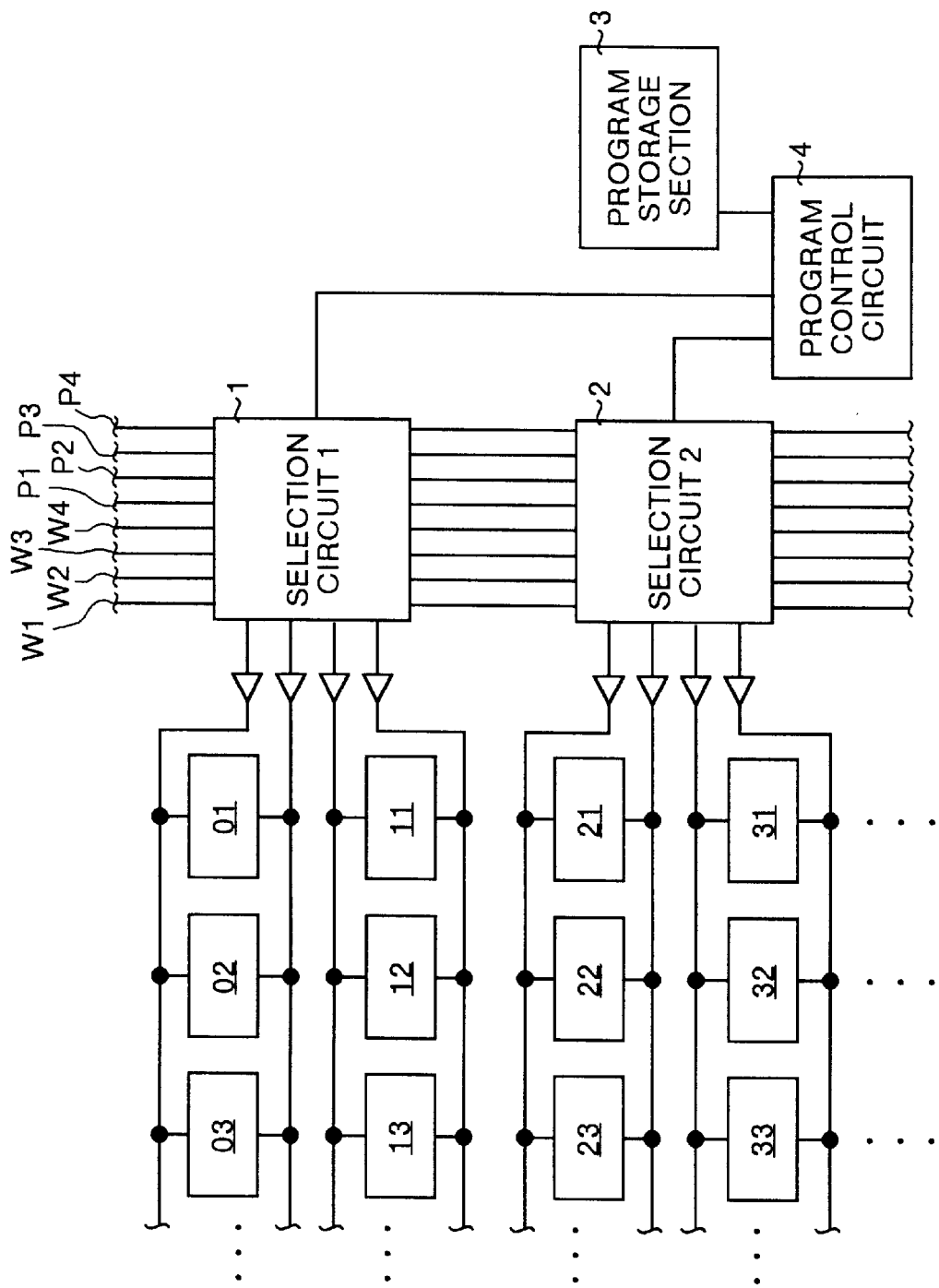
FIG. 7 is a schematic diagram showing another example of connections between the memory cells, the word lines, and the plate lines in the FeRAM according to the third embodiment.

FIG. 7 is a schematic diagram showing another example of connections between the memory cells, the word lines, and the plate lines in the semiconductor memory device according to the third embodiment. In the example shown in FIG. 7, the semiconductor memory device shown in FIG. 6 is provided with a program storage section 3 as a storage unit and a program control circuit 4 as a control unit. Therefore, this semiconductor memory device can programmably select a pair of word lines W and a pair of plate lines P, which are to be short-circuited.

The program storage section 3 stores a program which controls to select a pair of word lines W and a pair of plate lines P, which are to be short-circuited. The program storage section 3 consists of memory such as ROM, EEPROM, FeRAM, SRAM, or DRAM. The program control circuit 4 generates a selection signal based on the program stored in the program storage section 3, and outputs the signal to the selection circuits 1, 2, . . . as targets. Each of these selection circuits 1, 2, . . . performs short-circuit operations to a pair of word lines W and a pair of plate lines P based on the selection signal.

The effects due to the semiconductor memory device according to the third embodiment are explained below. In the example shown in FIG. 6, both the word lines W and the plate lines P connected to any two memory-cell rows are short-circuited based on the selection signal received from the outside. Whereas, in the example shown in FIG. 7, both the word lines W and the plate lines P connected to any two memory-cell rows are short-circuited based on the program stored in the program storage section 3.

The two memory-cell rows, connected to the corresponding word lines W and the plate lines P both of which are short-circuited, result in acquisition of the capacitance twice as large as that of the ferroelectric elements in a single memory-cell row. Therefore, if data such as cipher or the like are written, in the fabrication process, in the ferroelectric memory cell which has twice as much capacitance, the data such as cipher or the like can be held with the capacitance twice as large as the ordinary capacitance.

According to the third embodiment, as explained above, there is an advantage that the data such as cipher or the like written in the fabrication process can be held even after the fabrication has been completed, which is the same effect as that of the first embodiment. There is another advantage that any memory area, in which the cipher or the like are written, can be changed in the memory cell array according to the amount of data such as cipher or the like. Further, the selection circuits 1 and 2 are provided, which makes it difficult to trace the interconnections of the word lines W or the plate lines P. Therefore, it is possible to protect against illegal acquisition of cipher or the like by a third party through tracing of the interconnections of the word lines W or the plate lines P to check the memory area in which the cipher or the like are written. Namely, the higher level of security can be ensured.

Figure 8:
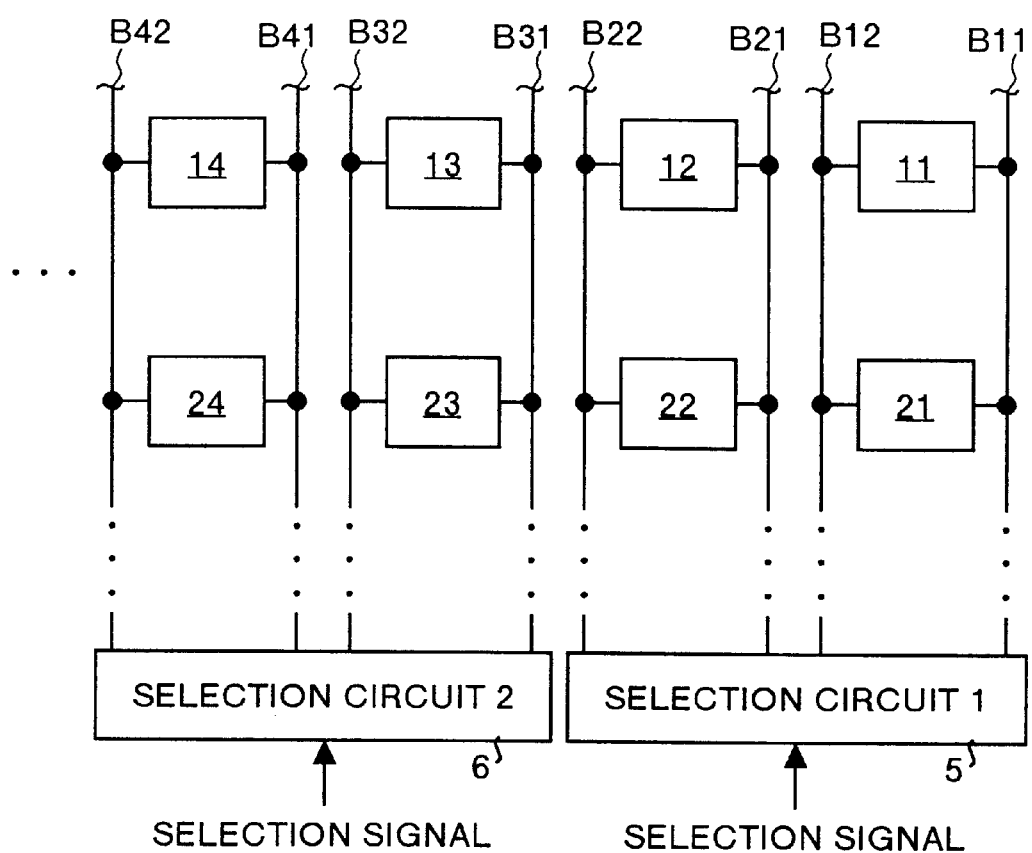
FIG. 8 is a schematic diagram showing connections between memory cells and bit lines in a FeRAM according to a fourth embodiment.

FIG. 8 is a schematic diagram showing connections between memory cells and bit lines in a semiconductor memory device according to a fourth embodiment. The fourth embodiment is realized by providing a plurality of selection circuits 5, 6, . . . (only two circuits are shown in FIG. 8); each circuit selects a pair of bit lines to be short-circuited, in the semiconductor memory device according to the second embodiment.

In the example shown in FIG. 8, the first pair of bit lines B11 and B12 are connected to the first memory-cell column. The second pair of bit lines B21 and B22 are connected to the second memory-cell column. The first selection circuit 5 then makes a selection, based on the selection signal received from the outside, as to whether one of the first pair of bit lines B11, B12 and one of the second pair of bit lines B21, B22, and the other one of the first pair of bit lines B11, B12 and the other one of the second pair of bit lines B21, B22 are to be concurrently short-circuited.

The third pair of bit lines B31 and B32 are connected to the third memory-cell column. The fourth pair of bit lines B41 and B42 are connected to the fourth memory-cell column. The second selection circuit 6 then makes a selection, based on the selection signal received from the outside, as to whether one of the third pair of bit lines B31, B32 and one of the fourth pair of bit lines B41, B42, and the other one of the third pair of bit lines B31, B32 and the other one of the fourth pair of bit lines B41, B42 are to be concurrently short-circuited. The same operations as explained above are performed to the fifth memory-cell column and the following columns.

Figure 9:
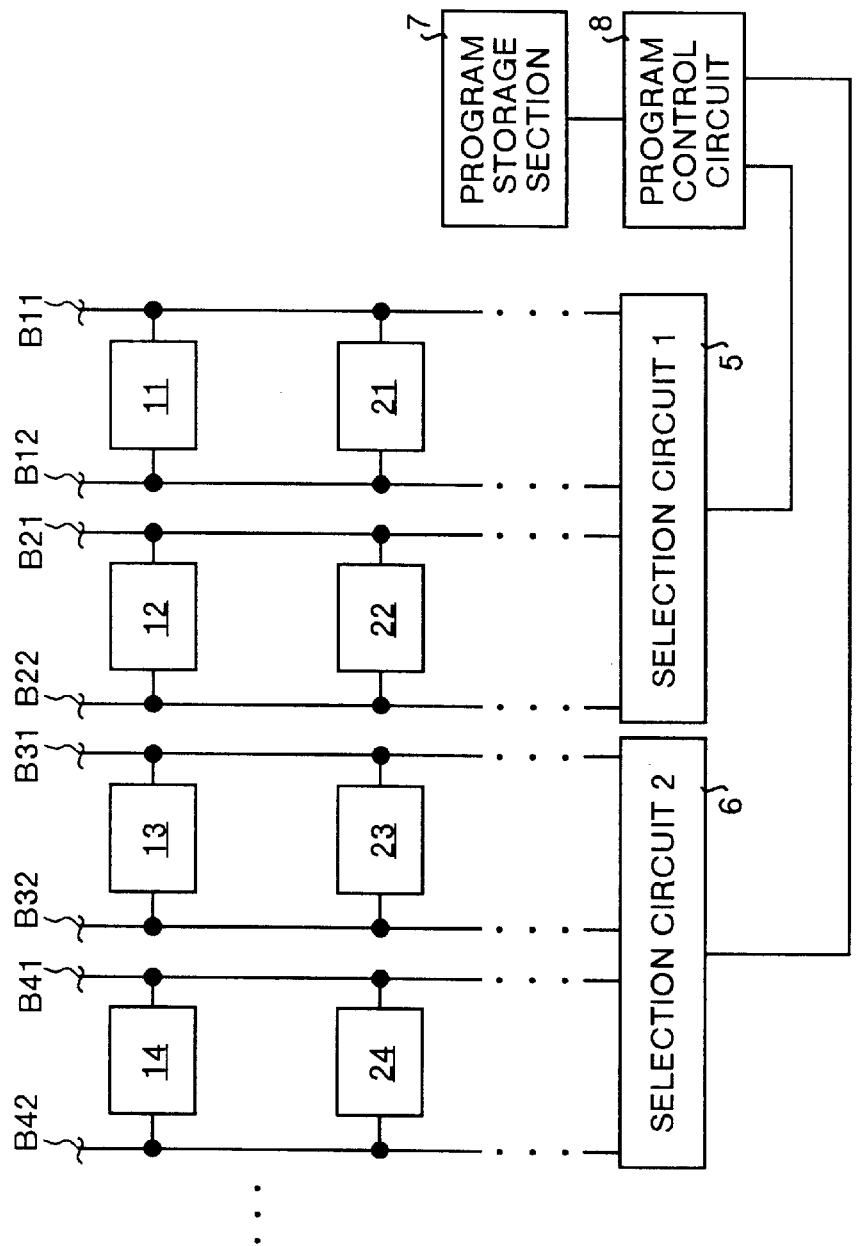
FIG. 9 is a schematic diagram showing another example of the connections between the memory cells and the bit lines in the FeRAM according to the fourth embodiment.

FIG. 9 is a schematic diagram showing another example of the connections between the memory cells and the bit lines in the semiconductor memory device according to the fourth embodiment. In the example shown in FIG. 9, the semiconductor memory device shown in FIG. 8 is provided with a program storage section 7 as a storage unit and a program control circuit 8 as a control unit. Therefore, this semiconductor memory device can programmably select two pairs of bit lines B and B which are to be short-circuited.

The program storage section 7 stores a program to select two pairs of bitlines B and B to be short-circuited. The program storage section 7 consists of memory such as ROM, EEPROM, FeRAM, SRAM, or DRAM. The program control circuit 8 generates a selection signal based on the program stored in the program storage section 7, and outputs the signal to the selection circuits 5, 6, . . . as targets. Each of these selection circuits 5, 6, . . . performs short-circuit operations to pairs of bit lines B and B based on the selection signal.

The effects due to the semiconductor memory device according to the fourth embodiment are explained below. In the example shown in FIG. 8, tow pairs of bit lines B and B connected to any two memory-cell columns are short-circuited based on the selection signal received from the outside. Whereas, in the example shown in FIG. 9, two pairs of bit lines B and B connected to any two memory-cell columns are short-circuited based on the program stored in the program storage section 7.

The two memory-cell columns, connected to the two pairs of bit lines B and B both of which are short-circuited, result in acquisition of capacitance twice as large as that of the ferroelectric elements in a single memory-cell column. Therefore, if data such as cipher or the like are written during the fabrication process in such a ferroelectric memory cell which has twice as much capacitance, the data such as cipher or the like can be held with the capacitance twice as large as the ordinary capacitance.

According to the fourth embodiment, as explained above, there is an advantage that the data such as cipher or the like written in the fabrication process can be held even after the fabrication has been completed, which is the same effect as that of the second embodiment. There is another advantage that any memory area, in which the cipher or the like are written, can be changed within the memory cell array according to the amount of data such as cipher or the like.

Further, the selection circuits 5 and 6 are provided, which makes it difficult to trace the interconnections of the bit lines B. Therefore, it is possible toprotect against illegal acquisition of cipher or the like by a third party through tracing of the interconnections of the bit lines B to check the memory area in which the cipher or the like are written. Namely, the higher level of security can be ensured.

Figure 10:
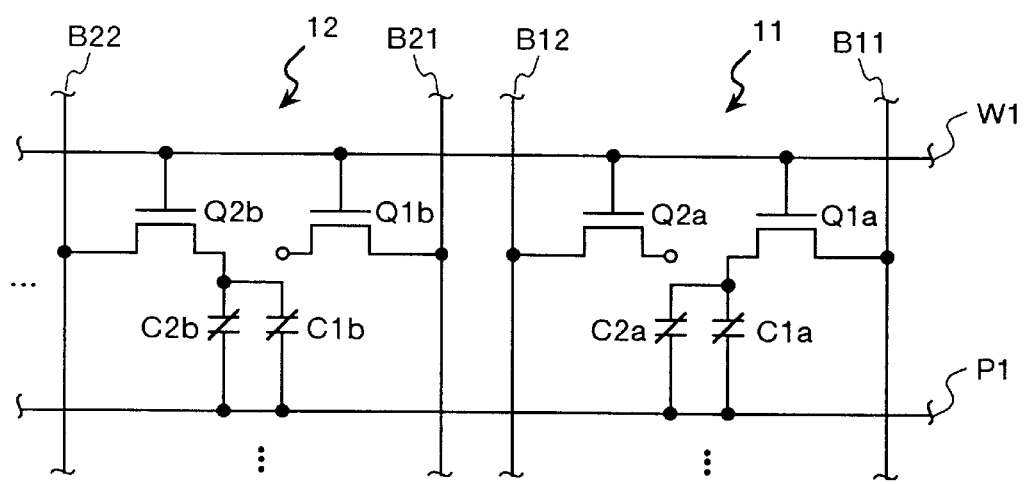
FIG. 10 is a schematic diagram showing connections between ferroelectric elements in memory cells, word lines, and bit lines in a FeRAM a to a fifth embodiment.

FIG. 10 is a schematic diagram showing connections between ferroelectric elements in memory cells, word lines, and bit lines in a semiconductor memory device according to a fifth embodiment. In this fifth embodiment, a plurality of ferroelectric elements (only two ferroelectric elements (ferroelectric capacitors) have been shown in FIG. 10) are provided in each memory cell. Based on this configuration, two ferroelectric elements C1a and C2a are connected in parallel between a transistor Q1a in the memory cell 11 and a plate line P1. At the same time, two ferroelectric elements C1b and C2b are connected in parallel between a transistor Q2b in the adjacent memory cell 12 and the plate line P1.

The ferroelectric C2a is insulated from the other transistor Q2a in the memory cell 11. Similarly, the ferroelectric C1b is insulated from the other transistor Q1b in the memorycell 12. Based on these configurations, the two cells of the memory cell 11 and the memory cell 12 are equivalent to a single memory cell which has the capacitance of the ferroelectric twice as large as that of the individual memory cell. Of four bit lines B11, B12, B21, and B22, the bit line B11 connected to the transistor Q1a and the bit line B22 connected to the transistor Q2b are activated with respect to the memory cell consisting of these two memory cells 11 and 12.

According to the fifth embodiment, as explained above, there is an advantage that the data such as cipher or the like written in the fabrication process can be held even after the fabrication has been completed, which is the same effect as that of the other embodiments. Further, there is another advantage that it is possible to protect against illegal acquisition of cipher or the like by a third party through checking of the memory area in which the cipher or the like are written. The reason is that the cell structure in the memory area which has twice as much capacitance of the ferroelectric is apparently the same as that in the memory area which has the ordinary capacitance. Namely, the security can be enhanced.

Figure 11:
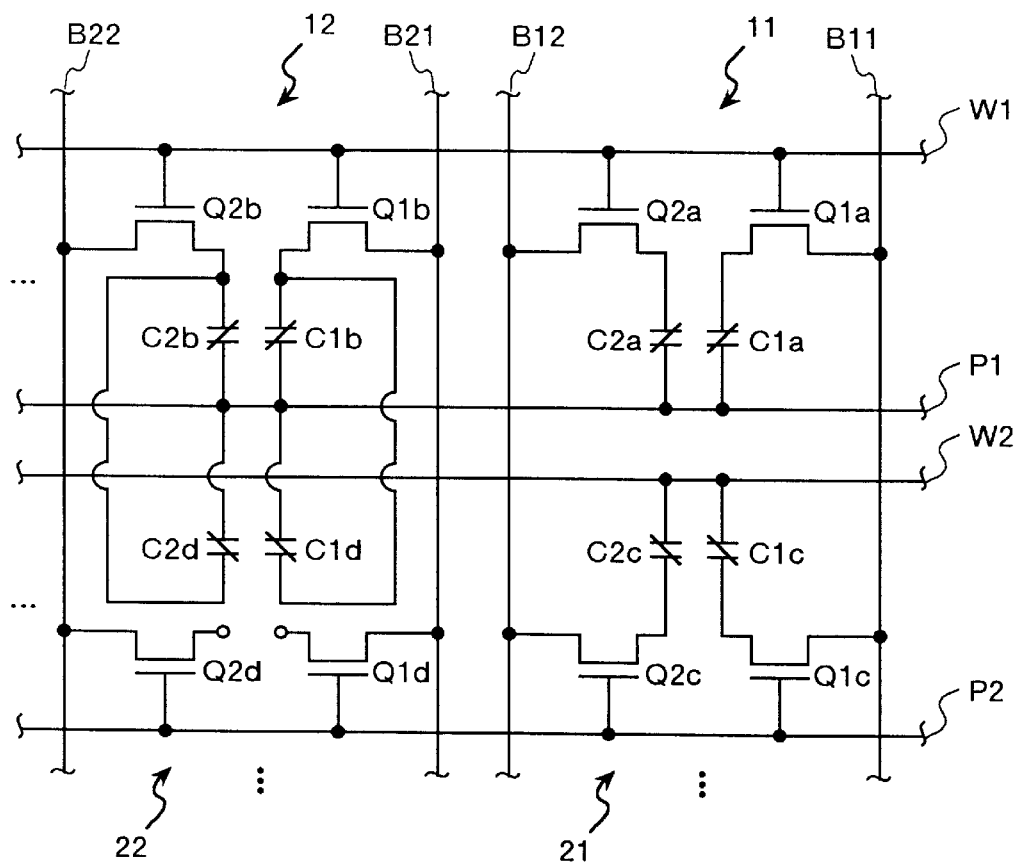
FIG. 11 is a schematic diagram showing how ferroelectric elements are connected to each other between adjacent memory cells in a FeRAM according to a sixth embodiment.

FIG. 11 is a schematic diagram showing how ferroelectric elements are connected to each other between adjacent memory cells in a semiconductor memory device according to a sixth embodiment. FIG. 11 shows case in which two ferroelectric elements (ferroelectric capacitors) are provided in each memory cell.

Namely, a ferroelectric C1b in a memory cell 12 and a ferroelectric C1d in a memory cell 22, which is adjacent to the memory cell 12, are connected in parallel between a transistor Q1b in the memory cell 12 and a plate line P1. The other ferroelectric C2b in the memory cell 12 and the other ferroelectric C2d in the memory cell 22 are connected in parallel between the other transistor Q2b in the memory cell 12 and the plate line P1.

The transistor Q1d is insulated from the ferroelectric C1d in the memory cell 22. Further, the transistor Q2d is insulated from the ferroelectric C2d. Further, the ferroelectric C1d and the ferroelectric C2d in the memory cell 22 are insulated from a word line W2.

Thus, the two memory cells 12 and 22 are equivalent to a single memory cell which has the capacitance of the ferroelectric twice as large as that of the individual memory cell. Of two word lines W1, W2 and two plate lines P1 and P2, the word line W1 and the plate line P1 which are connected to the memory cell 12 are activated with respect to the memory cell consisting of these two memory cells 12 and 22.

According to the sixth embodiment, as explained above, there is an advantage that the data such as cipher or the like written in the fabrication process can be held even after the fabrication has been completed, which is the same effect as that of the other embodiments.

Further, it is possible to protect against illegal acquisition of cipher or the like by a third party through checking of the memory area in which the cipher or the like are written. The reason is that the cell structure in the memory area which has twice as much capacitance of the ferroelectric is apparently the same as that in the memory area which has the ordinary capacitance. Namely, the higher level of security can be ensured.

In the present invention, the short-circuit operations may be provided to the word lines and the plate lines, or pairs of the bit lines over three or more memory-cell rows or three or more memory-cell columns. Further, the area of a ferroelectric in some of the memory cells may be made larger as compared to the ordinary area. Making the area of a ferroelectric larger can increase the ferroelectric capacitance of a corresponding memory cell. Thus, the data holding characteristic is enhanced, but the memory area, where data such as cipher or the like is written, can easily be identified instead.

According to the present invention, the capacitance of a ferroelectric memory cell in which cipher or the like is written in the fabrication process is increased to a larger amount as compared to that of the other ferroelectric memory cells. Therefore, even if the ferroelectric is affected by heat or exposed to hydrogen during fabrication, the characteristics of the memory cell are not degraded to such a level that the memory information may be lost. Thus, the ferroelectric memory cell can hold the memory information even after the fabrication has been completed.

Therefore, there is no need to remove external factors such as heat or hydrogen as much as possible. Thus, restriction to the fabrication process can be eliminated. Further, the need for some facilities to eliminate the influence of heat or hydrogen on the process is eliminated, which allows the manufacturing cost to be suppressed. Thus a low-cost semiconductor memory device can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-volatile ferroelectric semiconductor memory device comprising:

a memory cell array having a plurality of first ferroelectric memory cells and a second ferroelectric memory cell which hold data by remanence, wherein said second ferroelectric memory cell has a larger capacitance than said first ferroelectric memory cell;

a plurality of row selection lines by which said first ferroelectric cells and said second ferroelectric cells can be selected in the row direction in said memory cell array; and a plurality of column selection lines by which said first ferroelectric cells and said second ferroelectric cells can be selected in the column direction in said memory cell array, wherein said second ferroelectric memory cell is formed with a plurality of said first ferroelectric memory cells.

2. The non-volatile ferroelectric semiconductor memory device according to claim 1, wherein a plurality of said row selection lines, which correspond to a plurality of said first ferroelectric memory cells that form said second ferroelectric memory cell, are short-circuited.

3. The non-volatile ferroelectric semiconductor memory device according to claim 2 further comprises a plurality of selection circuits, which selection circuit can select a plurality of said row selection lines to be short-circuited.

4. The non-volatile ferroelectric semiconductor memory device according to claim 3 further comprising:

a storage unit which stores a program to select a plurality of row selection lines to be short-circuited; and a control unit which generates a selection signal to select a plurality of row selection lines as targets to be short-circuited and supplies the signal to said selection circuit based on said program.

5. The non-volatile ferroelectric semiconductor memory device according to claim 1, wherein a plurality of said column selection lines, which correspond to a plurality of said first ferroelectric memory cells that form said second ferroelectric memory cell, are short-circuited.

6. The non-volatile ferroelectric semiconductor memory device according to claim 5 further comprises a plurality of selection circuits, which selection circuit can cause a plurality of said column selection lines to be short-circuited.

7. The non-volatile ferroelectric semiconductor memory device according to claim 6 further comprising:

a storage unit which stores a program to select a plurality of column selection lines to be short-circuited; and a control unit which generates a selection signal to select a plurality of column selection lines as targets to be short-circuited and supplies the signal to said selection circuit based on said program.

8. A non-volatile ferroelectric semiconductor memory device comprising:

a memory cell array having a plurality of first ferroelectric memory cells and a second ferroelectric memory cell which hold data by remanence, wherein said second ferroelectric memory cell has a larger capacitance than said first ferroelectric memory cell;

a plurality of row selection lines by which said first ferroelectric cells and said second ferroelectric cells can be selected in the row direction in said memory cell array; and a plurality of column selection lines by which said first ferroelectric cells and said second ferroelectric cells can be selected in the column direction in said memory cell array, wherein said first ferroelectric memory cell has a plurality of ferroelectric capacitors; and said second ferroelectric memory cell has such a configuration that a plurality of said ferroelectric capacitors, included in said first ferroelectric memory cell, are connected in parallel to each other.

9. A non-volatile ferroelectric semiconductor memory device comprising:

a memory cell array having a plurality of first ferroelectric memory cells and a second ferroelectric memory cell which hold data by remanence, wherein said second ferroelectric memory cell has a larger capacitance than said first ferroelectric memory cells;

a plurality of row selection lines by which said first ferroelectric memory cells and said second ferroelectric memory cell can be selected in the row direction in said memory cell array; and a plurality of column selection lines by which said first ferroelectric memory cells and said second ferroelectric memory cells can be selected in the column direction in said memory cell array, wherein said first ferroelectric memory cell has a plurality of ferroelectric capacitors; and said second ferroelectric memory cell has such a configuration that a plurality of said ferroelectric capacitors, included in adjacent memory cells of said first ferroelectric memory cells, are connected in parallel to each other.

* * * * *